(12) United States Patent
Lezuo

(10) Patent No.: US 12,476,429 B2
(45) Date of Patent: Nov. 18, 2025

(54) PLUG CONNECTOR FOR DATA CABLES

(71) Applicant: Neutrik AG, Schaan (LI)

(72) Inventor: Patrick Lezuo, Davos Platz (CH)

(73) Assignee: Neutrik AG, Schaan (LI)

( * ) Notice: Subject to any disclaimer, the term of this patent is extended or adjusted under 35 U.S.C. 154(b) by 345 days.

(21) Appl. No.: 17/982,920

(22) Filed: Nov. 8, 2022

(65) Prior Publication Data
US 2023/0142723 A1 May 11, 2023

(30) Foreign Application Priority Data

Nov. 8, 2021 (AT) .............. A 50883/2021

(51) Int. Cl.
*H01R 24/64* (2011.01)
*H01R 13/66* (2006.01)

(52) U.S. Cl.
CPC ......... *H01R 24/64* (2013.01); *H01R 13/6658* (2013.01); *H01R 2201/04* (2013.01)

(58) Field of Classification Search
CPC . H01R 24/64; H01R 13/6658; H01R 2201/04
USPC .......................................... 439/676
See application file for complete search history.

(56) References Cited

U.S. PATENT DOCUMENTS

| | | | | |
|---|---|---|---|---|
| 7,785,135 B2 * | 8/2010 | Wu | ...................... | H01R 13/659 439/490 |
| 8,808,036 B2 * | 8/2014 | Xu | ..................... | H01R 13/6473 439/620.09 |
| 9,466,932 B2 * | 10/2016 | Hou | ........................ | H01R 24/66 |
| 9,516,757 B2 * | 12/2016 | He | ............................ | H05K 1/14 |
| 2002/0001160 A1 | 1/2002 | Berberich | | |
| 2014/0016289 A1 | 1/2014 | Chen et al. | | |
| 2014/0170904 A1 * | 6/2014 | Tang | .................. | H01R 13/6633 439/620.23 |
| 2015/0373860 A1 | 12/2015 | He et al. | | |
| 2016/0049757 A1 | 2/2016 | Hou et al. | | |
| 2016/0141811 A1 | 5/2016 | Hou et al. | | |
| 2020/0204399 A1 | 6/2020 | Crayford et al. | | |

FOREIGN PATENT DOCUMENTS

| | | |
|---|---|---|
| CN | 203932534 | 11/2014 |
| CN | 104810684 A | 7/2015 |
| CN | 105337086 | 2/2016 |
| CN | 105680230 | 6/2016 |
| JP | 2001284828 A | 10/2001 |
| JP | 2005522854 A | 7/2005 |

(Continued)

*Primary Examiner* — Gary F Paumen
(74) *Attorney, Agent, or Firm* — Volpe Koenig

(57) ABSTRACT

A plug connector for the mechanical and electrical connection to cable plugs of data cables has a housing (2) having at least one plug-in opening (1) for a complementary plug connector. Multiple electrical contact elements (5) protrude into the plug-in opening (1) and are guided on the rear side of the housing (2) on its outer side and are connected to a printed circuit board (6) fastened on the outside on the housing (2). The printed circuit board (6) carries a circuit and connection elements (7) for further electronic assemblies. This circuit on the printed circuit board (6) includes an assembly for galvanic isolation of the network signals, in which at least one chip-LAN transformer (13) mounted on the printed circuit board (6) is provided for each data line.

15 Claims, 9 Drawing Sheets

(56) References Cited

FOREIGN PATENT DOCUMENTS

| | | | |
|---|---|---|---|
| JP | 2005252629 | A | 9/2005 |
| JP | 2017028005 | A | 2/2017 |
| JP | 2018536974 | A | 12/2018 |
| TW | M468804 | | 12/2013 |

* cited by examiner

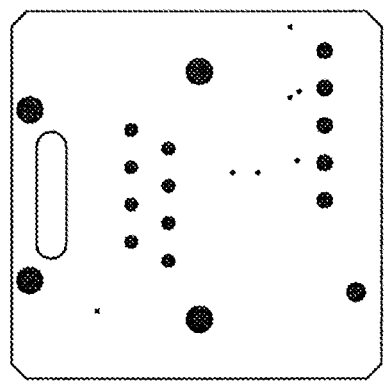
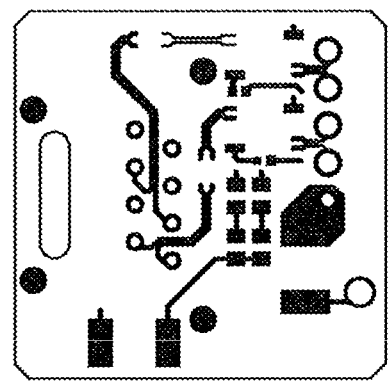
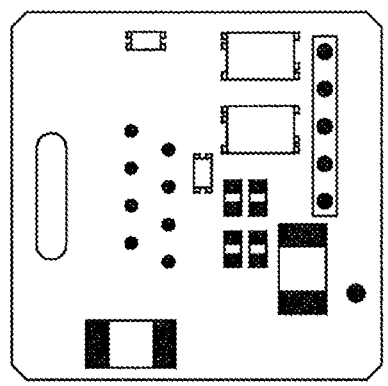
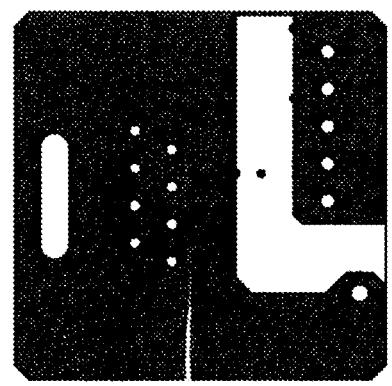
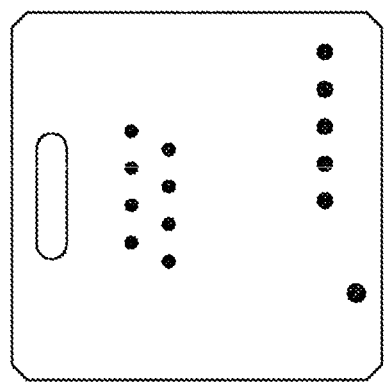
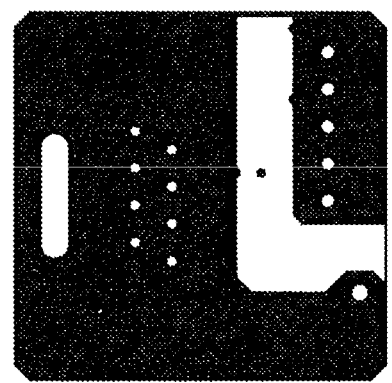
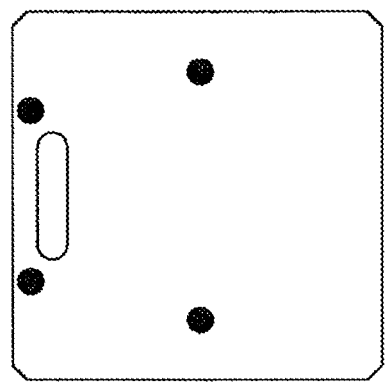
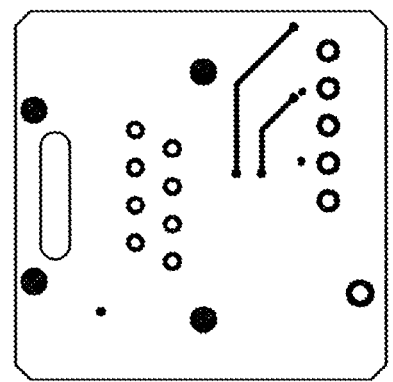
Fig.11

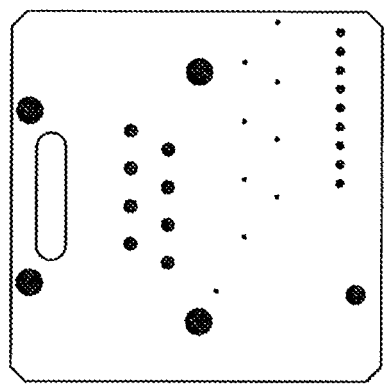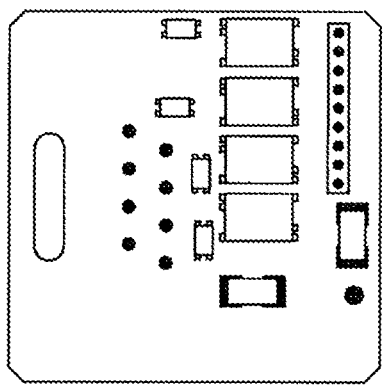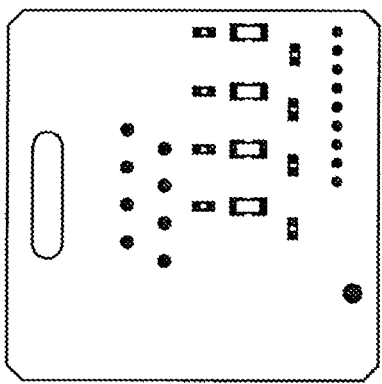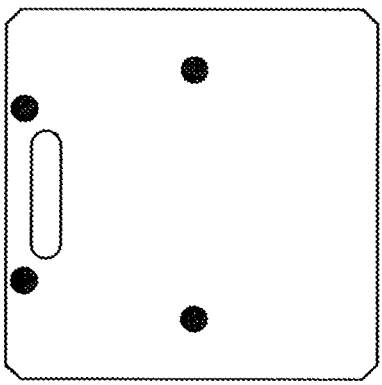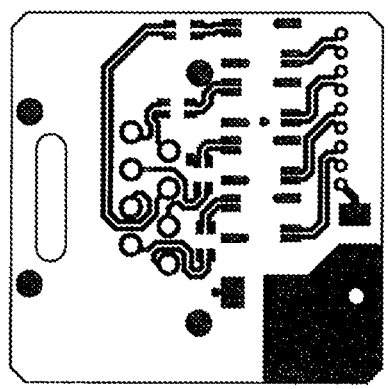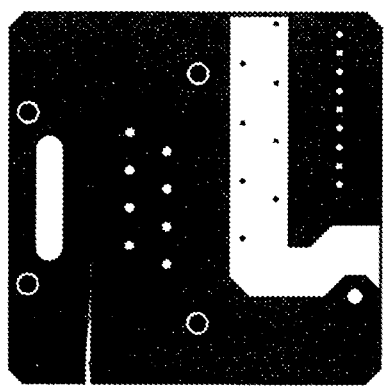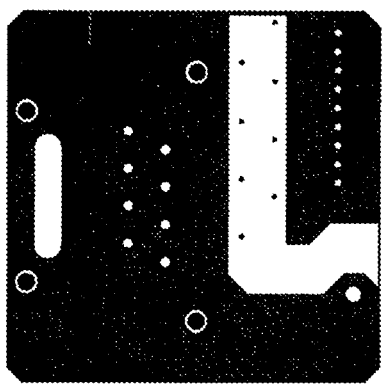
Fig.12

PLUG CONNECTOR FOR DATA CABLES

INCORPORATION BY REFERENCE

The following documents are incorporated herein by reference as if fully set forth: Austrian Patent Application No. A 50833/2021, filed Nov. 8, 2021.

TECHNICAL FILED

The invention relates to a flush-type plug connector for data cables, in particular for network applications.

BACKGROUND

An embodiment as an RJ45 chassis socket having a plug-in opening for a compatible cable plug for transferring the electronic data is preferred. The invention is therefore explained on the basis of this preferred exemplary embodiment, wherein the fundamental concepts can be transferred to all other models of plug connector types.

The electrical contact elements protruding into the plug-in opening, for example the RJ45 pins, are led back out of the housing on the rear side and are electrically supplied there using an electronic circuit on a printed circuit board. This is mechanically connected to the housing. The circuit on the printed circuit board is provided with connection elements for further electronic assemblies of the device in which the flush-type plug connector is installed.

In the past, an RJ45 chassis socket has only passed on the signals to the main PCB board, and a separate section of the main PCB board has taken over the high-voltage insulation and signal conditioning. In more recent times, hand-wound ferrite rings have been integrated for the high-voltage insulation into the housing of RJ45 chassis sockets, but the further signal conditioning still took place on the main PCB board. Only the completely conditioned data signals can then be passed on to an ethernet PHY chip on the low-voltage region of the main PCB board, to then be further processed there.

The prior art in this field is the integration of hand-wound ferrite core rings in integrated modules, which are integrated separately on the main PCB mainboard, normally remotely from the flush-type plug connector, or can also be provided on the printed circuit board of the flush-type plug connector before the electrical connection to the electronic circuit of the device. They are preferably embedded using a polymer in a separate chamber to eliminate vibrations of the transformers. Due to the hand-wound ferrite rings, there is a broad variation of the network signal voltage quality, since uniform manufacturing quality cannot be ensured here. One example of such ferrite core rings is described as prior art in US 2014/016289 A1.

Furthermore, an electrical plug connector for network data transfer is disclosed in CN 105337086 A, in which chip-type transformers are used. CN 105680230 A also discloses a similar embodiment.

SUMMARY

A network communication assembly is described in US 2014/016289 A1, in which SMD transformers or chip transformers and choke coils are used in an assembly for galvanic isolation in the signal path. In addition, adapting the lengths of the electrical connections between the transformer and the associated choke coil or between other components of the circuit to the existing requirements and space conditions is disclosed.

The object of the present invention was therefore to overcome the disadvantages of the prior art and to provide a flush-type plug connector which, with compact construction and optimum signal quality, enables a direct connection to the PHY chip of the device circuit.

This object is achieved by a device and a method having one or more of the features disclosed herein.

To achieve this object, the flush-type plug connector described at the outset, in which at least one ethernet transmitter is provided between the input and the electronic circuit of the device in the signal path of each channel, in order to ensure important functions such as high-voltage insulation, impedance adjustment, noise suppression, and/or signal transmission, is distinguished by the fact that the circuit includes on the printed circuit board an assembly for galvanic isolation of the network signals, and this assembly has at least one chip-LAN transformer mounted on the printed circuit board for each data line. These features characterize a flush-type plug connector having directly integrated ethernet transmitter having galvanic isolation of the network signals in a single, compact component. For this purpose, chip-LAN transformers and chip chokes from automatic production are preferably used, which are exclusively assembled in automatic SMT technology. This results in more uniform network signal quality and compact structure and integration.

It is preferably provided here that a common mode choke mounted on the printed circuit board is assigned to each chip-LAN transformer.

The circuit preferably includes an assembly for current limiting on the printed circuit board.

One advantageous embodiment of the plug connector according to the invention is distinguished by the fact that the circuit on the printed circuit board includes a network termination, preferably a Bob Smith termination. Therefore, the proper network termination is already ensured by installation of a chassis socket according to the invention, independently of the construction of the device or of its electronic circuit. Of course, an adjustment of the resistance value from the standard 75 ohms to other optimized values could also be performed here.

The electronic circuit of the flush-type plug connector according to the invention ensures the required functionality for ethernet network plug connections, and also the Bob Smith termination and the current limiting, preferably organized as a common functionality in a single component of standardized dimensions. Due to this novel invention, the network signals can be conducted at the rear on the RJ45 chassis via the small PCB board directly to the ethernet PHY chip, for example, using a flat band cable without additional, sealed-off high-voltage region separately on the main PCB mainboard having the direct signal transmission to the ethernet PHY network chip or direct connection using a pin connector directly on the main PCB mainboard.

A multi-layered, in particular four-layered PCB print is preferably used here as the printed circuit board, preferably exclusively having machine equipping with SMT, wherein the dimensions of the printed circuit board as a square having a side length of 25 mm are retained. Compliance with the norm IEEE 802.3af is thus also ensured and the flush-type plug connector according to the invention is suitable in its standard construction for approximately 80% of the ethernet PHYs on the market.

Resistors, capacitors, and diodes are additionally installed on the small PCB board to ensure the electronic signal voltage integrity and the current limiting of the electronic circuit. Depending on the selection of the ethernet PHY chip and how it is constructed in the interior, the electronic circuit possibly has to be separately adapted accordingly. This can also be implemented by more integrated chips having the electronic components indicated above or by new components which are coming onto the market for the first time.

The two (100 MB/s) or four (1 GB/s) signal pairs of the network signals are differentially designed and implemented on the novel small PCB board to keep the signal lengths and signal runtimes constant.

The sequence of the electrically conductive layers of the PCB print comprises according to the invention an uppermost copper layer, a first dielectric material, a first inner copper layer, a core dielectric material, a second inner copper layer, a second dielectric material, and finally a lowermost copper layer.

An embodiment is preferred here in which the core dielectric material has a greater thickness than the first and/or second dielectric material, preferably a thickness greater by a factor of 10.

Additionally or alternatively, the inner copper layers advantageously have a greater thickness than the uppermost and/or the lowermost copper layer, preferably a thickness greater by a factor of 2.

A further advantageous embodiment of the invention is distinguished by the fact that grounding takes place via one of the connection elements and the two inner copper layers and the lowermost copper layer.

As an alternative solution, in particular in the case of flush-type plug connectors for higher bandwidths, grounding via one of the contact elements and the two inner copper layers and the lowermost copper layer can also be provided.

The grounding via one of the contact elements and the grounding via one of the connection elements can be interconnected via a capacitor in an alternative embodiment of the invention.

BRIEF DESCRIPTION OF THE DRAWINGS

For better understanding of the invention, it is explained in more detail on the basis of the following figures.

In the greatly simplified, schematic figures:

FIG. 11 shows graphic representations of the Gerber files for a preferred PCB layout for the printed circuit board of a flush-type plug connector according to the invention in a 100 MBit/s variant, and FIG. 12 shows graphic representations of the Gerber files for a preferred PCB layout for the printed circuit board of a flush-type plug connector according to the invention in a 1 GB/s variant.

DETAILED DESCRIPTION

As an introduction, it is to be established that identical parts are provided with identical reference signs or identical part names in the differently described embodiments, wherein the disclosures contained in the entire description can be transferred accordingly to identical parts having identical reference signs or identical part names. The location specifications selected in the description, e.g., above, below, laterally, etc. are also related to the immediately described and shown figure and these location specifications are to be transferred accordingly to the new location in the event of a location change. Finally, for the sake of order it is to be noted that for better understanding of the structure elements have partially been shown not to scale and/or enlarged and/or reduced in size.

Figure 1:
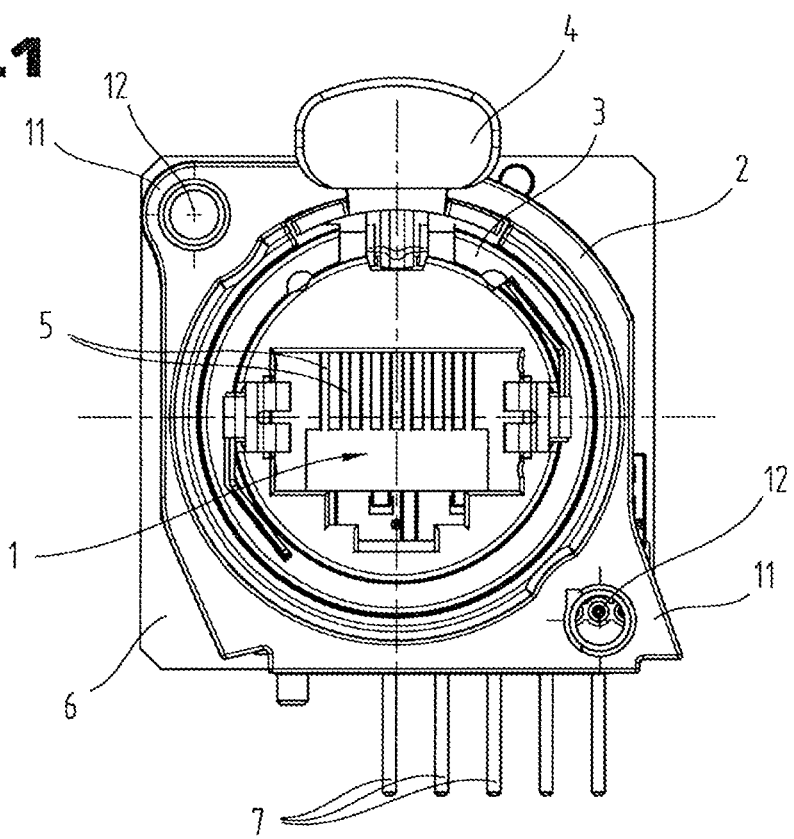
FIG. 1 shows a front view of one embodiment of a flush-type plug connector according to the invention in a 1 GB/s variant.
Figure 2:
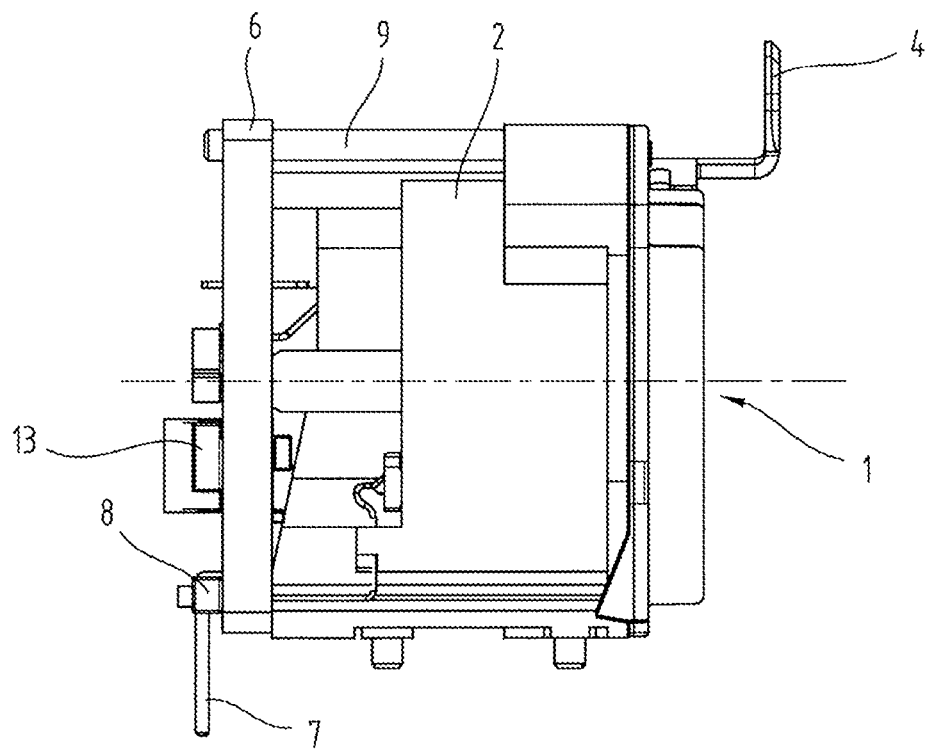
FIG. 2 shows a side view of the flush-type plug connector of FIG. 1.
Figure 3:
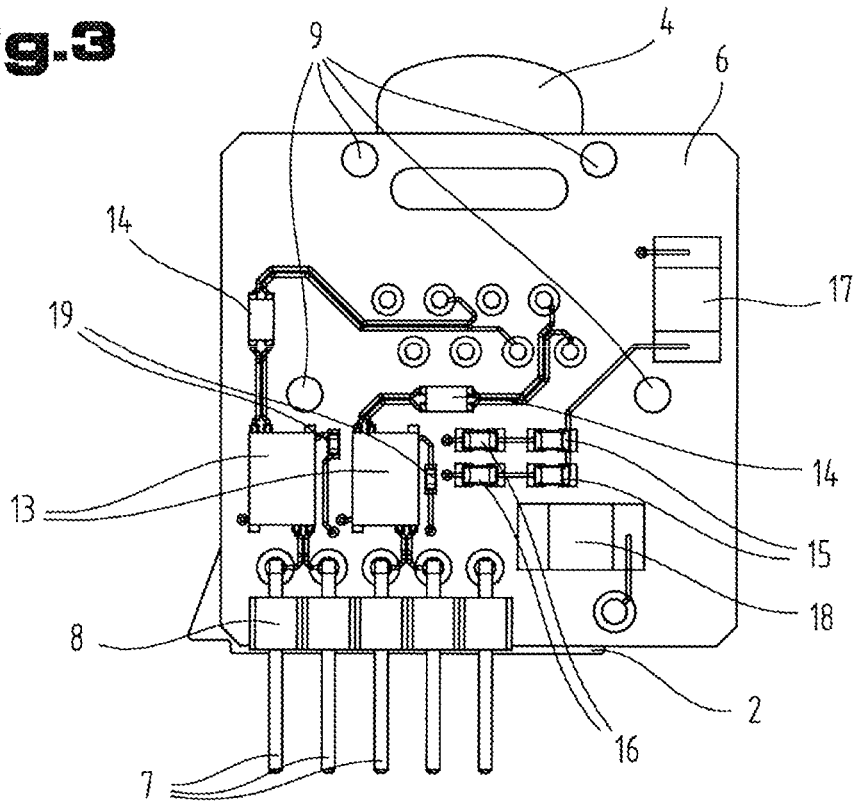
FIG. 3 shows a view of the flush-type plug connector of FIG. 1 from the rear.
Figure 4:
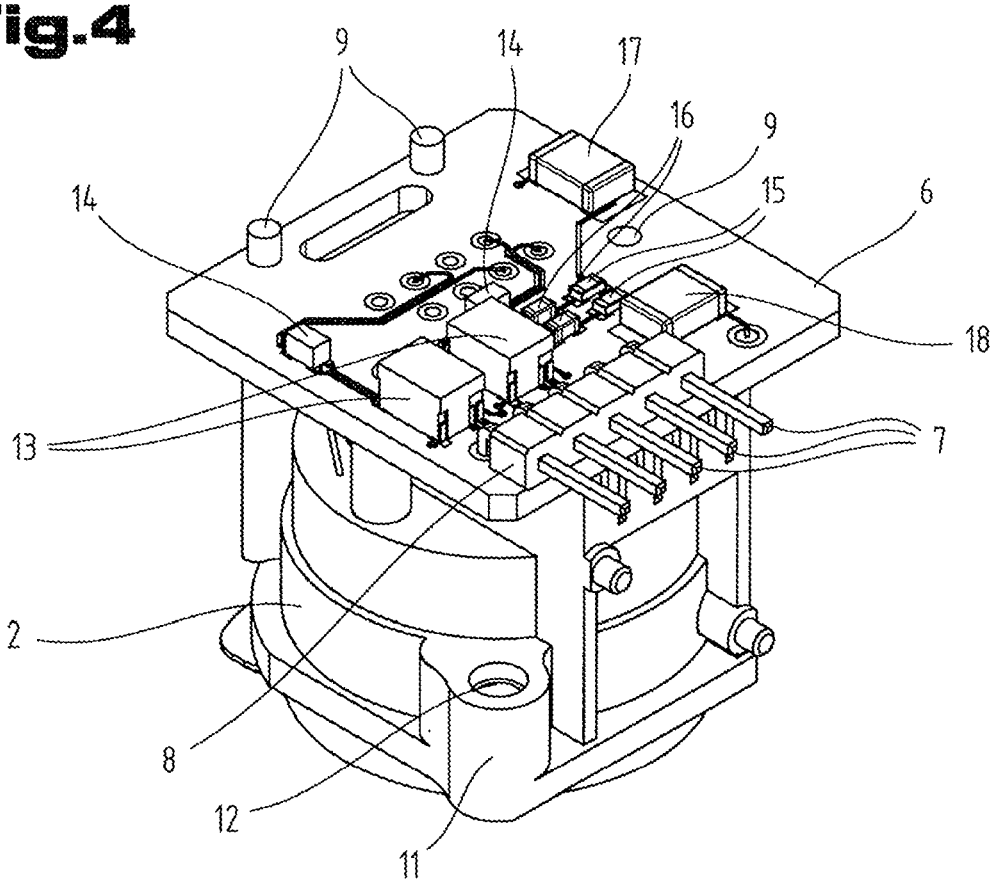
FIG. 4 shows a perspective view from the rear of a further embodiment of a flush-type plug connector according to the invention in a 100 MBit/s variant.

FIG. 1 shows a view of a first exemplary embodiment for a flush-type plug connector according to the invention from the front, looking toward the plug-in opening 1 for a complementary cable plug connector, in the preferred embodiment as an RJ45 chassis socket for installation in network-capable devices, switchboards, or the like. The housing 2 of the flush-type plug connector preferably has, concentrically with the plug-in opening 1 for the cable plug, an annular receptacle 3 for a cylindrical socket-shaped plug-in extension of a protective housing of the cable plug. The housing 2 is advantageously equipped with a locking assembly for the cable plug or its plug-in extension, wherein the locking can be manually released by means of an actuating element 4 protruding on the front side.

The electrical contact elements 5 protruding into the plug-in opening 1, for example, the RJ45 pins, are led back out of the housing 2 on the rear side and are electrically connected there to an electronic circuit on a printed circuit board 6 mounted vertically oriented on the rear side of the housing 2. The circuit on the printed circuit board 6—which is explained in detail hereinafter—is equipped with connection elements 7 in the form of contact pins for the connection to further electronic circuits, which are assembled into a pin header 8. Since of the nine standard contact elements 5 in embodiments for low bandwidth, as in the variant shown at 100 Mbit/s, only two pairs of data lines are used, and one of the contact elements 5 is used for grounding, five connection elements 7 are provided. The network signals of the cable plug are typically conducted via the contact elements 5, the electronic circuit of the printed circuit board 6, and the connection elements into an electronic circuit of a network-capable device having an ethernet PHY chip.

The attachment of the printed circuit board 6 on the housing 2 comprises an arrangement of mounting pins 9 on the housing, for which corresponding mounting bores 10 are provided in the printed circuit board 6. Moreover, the printed circuit board 6 is soldered at the rear onto the housing 2, if the housing consists of metal, or is adhesively bonded or ultrasonically welded, if it consists of plastic.

The housing 2 itself has mounting tabs 11 having mounting bores 12 for mounting in the device, the switchboard, or the like. Other possible embodiments are provided with a protruding rectangular or square mounting flange on the front side of the housing 2, in which the mounting bores 12 are worked out. The dimensions of the printed circuit board 6 essentially correspond to the dimensions of the housing 2 transversely to its longitudinal axis, typically in the range 25 mm×25 mm, so that a simple installation in a standardized opening in the device or the switchboard is possible from the front, after which the flush-type plug connector can then be screwed in flush with the device front plate or the switchboard.

The circuit on the printed circuit board 6 also comprises, in addition to the conventionally known components, an assembly integrated directly on the printed circuit board 6 for galvanic isolation of the network signals between the input and the passing on to the downstream electronic circuit, for example, the PHY chip. This assembly has at least one chip-LAN transformer 13 mounted directly on the printed circuit board 6 for each of the two pairs of data lines. A common mode choke 14, preferably in the form of a chip choke, is preferably assigned to each of these LAN transformers. Both transformers, both the chip-LAN transformer 13 and also the common mode choke 14, are components from automatic production, which are assembled exclusively in automatic SMT technology. The circuit on the printed circuit board 6 can advantageously also comprise an assembly for current limiting. The flush-type plug connector according to the invention having the printed circuit board designed as described, with compact construction and optimum signal quality, enables a direct connection to for example the PHY chip of a device circuit.

A network termination is also integrated on the printed circuit board 6 in the circuit implemented there, preferably a Bob Smith termination having its 75-ohm resistors 15 and advantageously capacitors 16 connected in series thereto. Instead of the standard resistors having 75 ohm, other values could also be selected for optimum design of the circuit adapted to the respective conditions. The grounding of the input of the flush-type plug connector via one of the contact elements 5 is implemented via the Bob Smith termination 15, 16 and an interference suppression capacitor 17. If desired, the grounding of the input can be connected to the grounding of the printed circuit board via a further capacitor 18. This optional capacitor 18 also offers an additional overvoltage protection, in a base variant of the printed circuit board 6 or its circuit, only the correspondingly prepared solder pads are provided. Interference suppression capacitors 19 are also connected in the grounding of the printed circuit board 6.

Figure 5:
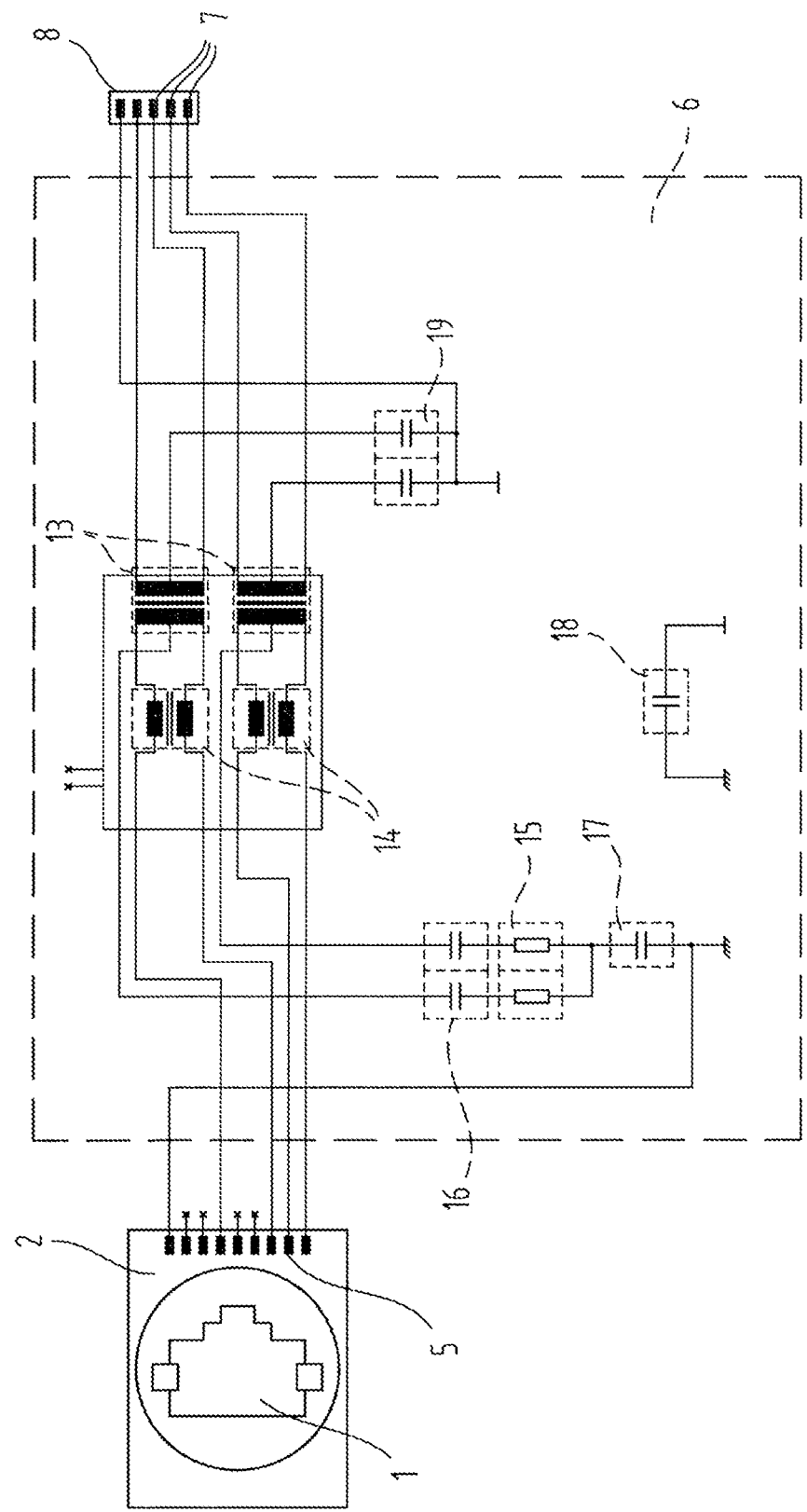
FIG. 5 shows an exemplary circuit diagram for a flush-type plug connector according to the invention in a 100 MBit/s variant.

FIG. 5 shows the electrical circuit diagram for a 100 MB/s variant of the circuit on the printed circuit board 6 of a flush-type plug connector according to the invention, as is shown in FIGS. 1 to 4, and having the specific interconnection of the components mentioned in the preceding paragraphs.

Figure 6:
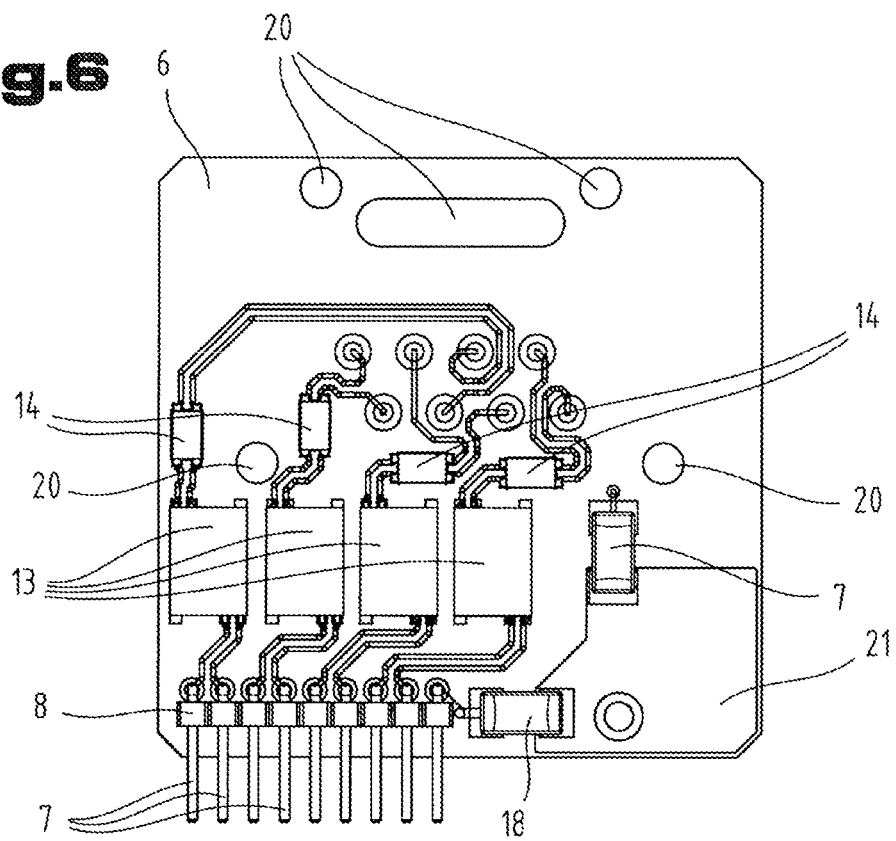
FIG. 6 shows a view of the side facing to the rear of the printed circuit board of a flush-type plug connector according to the invention in a 1 GB/s variant.

FIG. 6 shows a view of the side facing to the rear, away from the housing 2 of the flush-type plug connector, of the printed circuit board of the flush-type plug connector according to the invention for higher bandwidths, for example, a 1 GB/s variant, in which eight of the contact elements 5 of the flush-type plug connector are used for four pairs of data lines and one of the contact elements 5 is again used for the grounding. The greater number of components here, which are required on the printed circuit board 6 for the four pairs of data lines, are distributed on both sides of the printed circuit board 6 here. Even higher bandwidths are also possible using correspondingly designed components, wherein then flush-type plug connectors can be implemented in variants having 2.5 GB/s, 5 GB/s, and even 10 GB/s.

Mounting bores 20 are used for the correct alignment and the fixing of the printed circuit board 6 on the housing 2. The pin header 8 has nine connection elements 7. The assembly, which is also integrated here on the printed circuit board 6, for galvanic isolation of the network signals between the input and the passing on to the downstream electronic circuit comprises four chip-LAN transformers 13 mounted directly on the printed circuit board 6, each having an assigned common mode choke 14, preferably in the form of a chip choke. All of these components are advantageously again from automatic production, which are assembled exclusively in automatic SMT technology. An assembly for current limiting can advantageously again be included.

Figure 7:
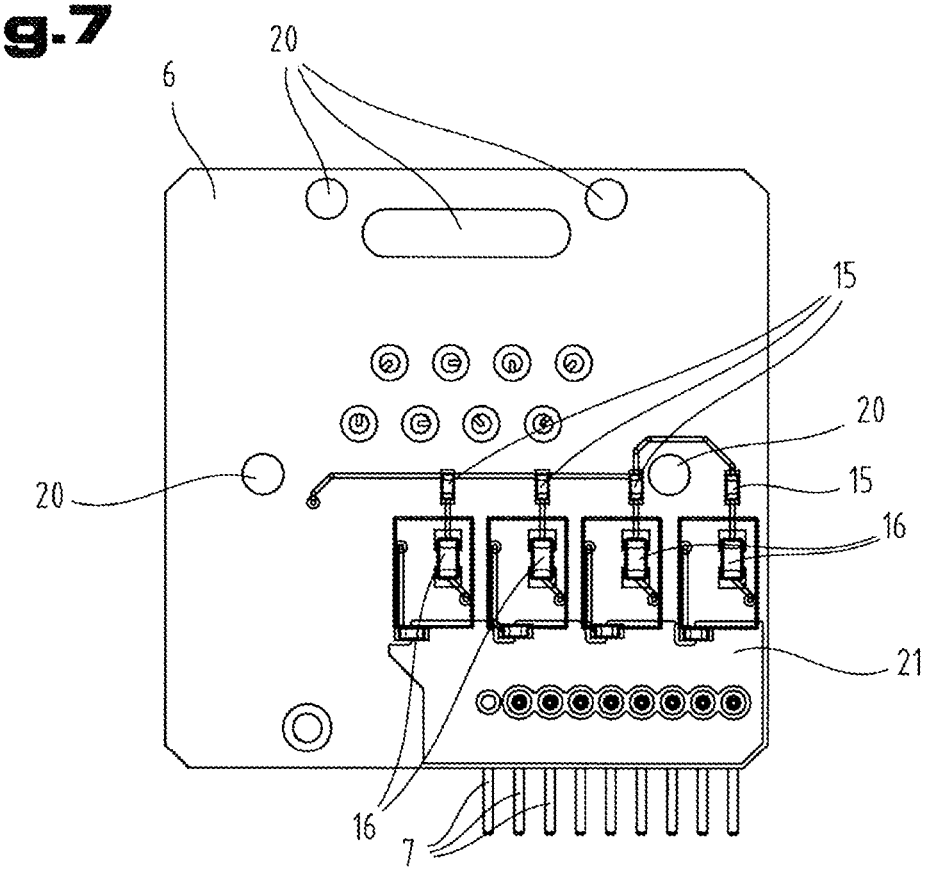
FIG. 7 shows a view of the side facing the housing of the printed circuit board of a flush-type plug connector according to the invention in a 1 GB/s variant.
Figure 8:
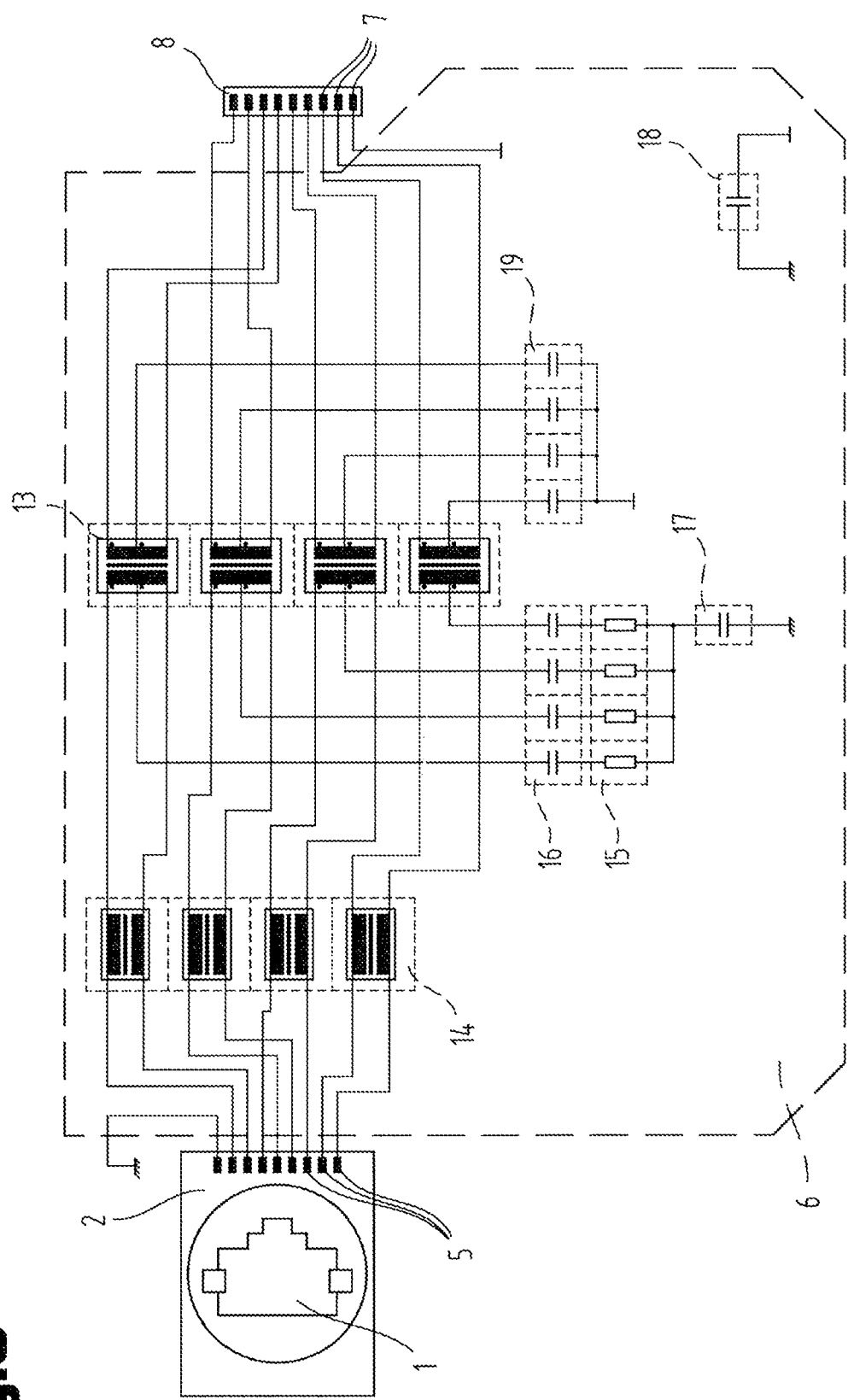
FIG. 8 shows an exemplary circuit diagram for a flush-type plug connector according to the invention in a 1 GB/s variant.

On the opposite side of the printed circuit board 6, which faces toward the housing 2 and is shown in FIG. 7, the components for the network termination are integrated, preferably again a Bob Smith termination having its 75-ohm resistors 15 and advantageously capacitors 16 connected in series thereto. The interference suppression capacitor 17 interconnected between the Bob Smith termination 15, 16 and the grounding of the input of the flush-type plug connector is installed due to the limited space conditions between housing 2 and printed circuit board 6 on the side facing away from the housing 2, as are the solder pads and, if required, the optional capacitor 18 for the overvoltage protection and the connection of the grounding of the input of the flush-type plug connector to the grounding of the printed circuit board 6. The arrangement of further interference suppression capacitors 19 can also be advantageous.

Since a larger number of electronic components are provided in the flush-type plug connectors for higher bandwidths, a more intensive grounding accordingly also has to be used, which in FIGS. 6 and 7 comprises the copper regions 21 on both sides of the printed circuit board 6. One of these copper regions 21 is the ground for the PCB circuit and the other copper region is the ground of the input of the flush-type plug connector.

The printed circuit board 6 is designed and constructed as a PCB print made up of many layers of dielectric materials and copper layers, so that the impedance of the entire electronic circuit harmonizes together. A four-layered PCB print is preferably used for the printed circuit board 6, preferably having exclusively mechanical equipping with SMT, wherein the dimensions of the printed circuit board as a square having a side length of approximately 25 mm are preferred, to enable the simple installation in the receptacle openings of devices and switchboards. Complying with the norm IEEE 802.3af is thus also ensured and the flush-type plug connector according to the invention is suitable in its standard construction for approximately 80% of the ethernet PHYs on the market.

Figure 9:
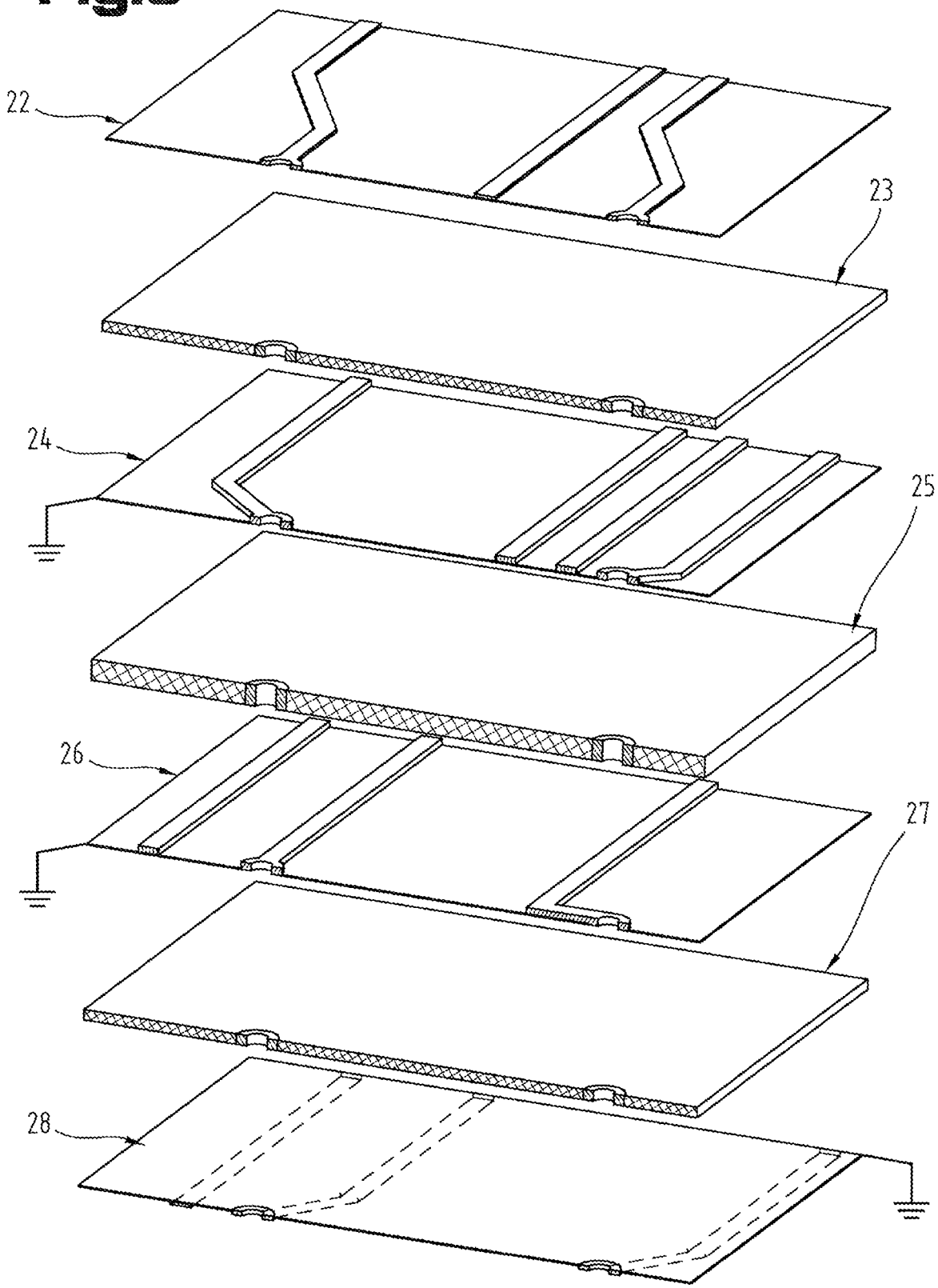
FIG. 9 shows an exploded view of a preferred exemplary embodiment of a printed circuit board.
Figure 10:
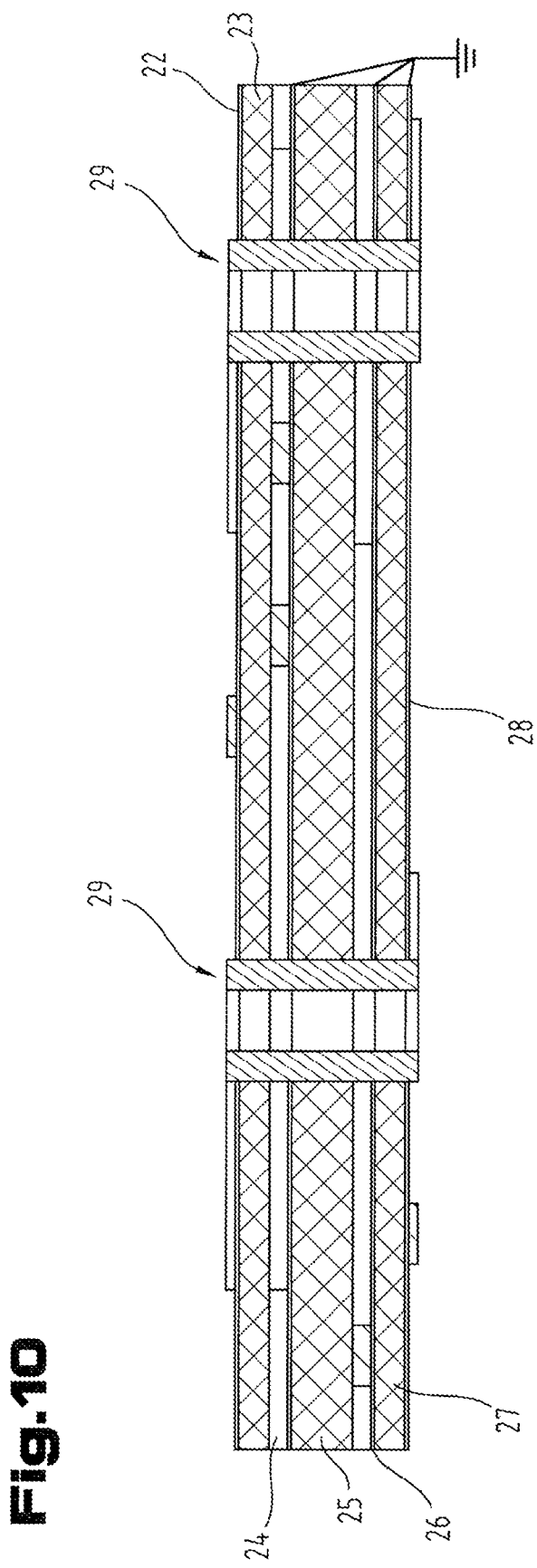
FIG. 10 shows a vertical cross section through the printed circuit board of FIG. 9.

One preferred exemplary embodiment, as shown in FIGS. 9 and 10, consists here of a sequence of an uppermost copper layer 22, followed by a first dielectric material 23, a first inner copper layer 24, a core dielectric material 25, a second inner copper layer 26, a second dielectric material 27, and finally a lowermost copper layer 28. A core dielectric material 25 having a greater thickness than the first and/or second dielectric material 23 or 27 is preferred here. A thickness of the core dielectric material 25 greater by a factor of 10 has proven to be particularly advantageous here.

It is also advantageous in the copper layers if the inner copper layers 24 and 26 have a greater thickness than the uppermost and/or the lowermost copper layer 22 or 28. However, a thickness of the inner copper layers 24 and 26 only greater by a factor of 2 is typically required here.

A specific, particularly advantageous exemplary embodiment, which is also shown in the print structure in FIGS. 11 and 12, has the following dimensions here: The thickness of the uppermost copper layer 22 is 0.018 mm, this is followed by a dielectric material 23 having a thickness of 0.12 mm. A first inner copper layer 24 having a thickness of 0.035 mm is followed by a core dielectric material 25 at 1.2 mm, and then by a second inner copper layer 26 having a thickness of 0.035 mm. After a further dielectric material 27 of 0.12 mm, the lowermost copper layer 28 having a thickness of 0.018 mm follows.

Furthermore, through contacts (or vias) 29 are shown by way of example in FIGS. 9 and 10, which form vertical electrical connections between the conductor track levels or the copper layers 22, 24, 26, 28 of the printed circuit board 6, preferably implemented in each case by an internally metallized bore in the carrier material of the printed circuit board. In addition to the continuous through contacting shown here, blind vias (pocket holes) or buried vias (internal connections) could additionally be provided if needed.

The images of FIG. 11 are graphic representations of the Gerber files for a preferred PCB layout for a printed circuit board 6 according to the invention of a flush-type plug connector according to the invention. The Gerber file, which is created by the PCB design program, contains all items of information which are necessary to automatically produce a PCB board. Images 11.5 to 11.8 of FIG. 11 contain the conductive copper layers, which are shown in black. The white regions have no copper and are therefore insulation or dielectric material.

In addition, the position of the individual electronic components on the PCB board is of decisive importance with respect to the functionality of the entire electronic circuit, since the transmitted signal form may be influenced in this way.

The different layers which are represented by the images of FIGS. 11 and 12 are stacked, wherein both the arrangement of the electronic components on the layers and also the arrangement/stacking of the individual layers play a decisive role. The two examples shown for low bandwidth (100 MB/s) in FIG. 11 and for high bandwidth (1 GB/s) in FIG. 12 function in an optimal manner with precisely this arrangement of the electronic components on the individual layers and precisely this stacking of the individual layers.

In the PCB layout of FIG. 11, the individual PCB layers are shown which are used for signal transmission and grounding. This special design layout is also used to ensure the EMC compatibility, because emission of the electromagnetic radiation is significantly reduced by a separate introduced grounding layer (see images 11.6 and 11.7 of FIGS. 11 and 12) and the surrounding electronics are not impaired in their function.

With respect to the sequence of the stacking of the layers: In each of the many successive sketches, a view of a layer is shown, as if one were looking at the layer from the back/from the rear side. The uppermost image corresponds in each case here to the uppermost layer in the stack, the lowermost image corresponds to the lowermost layer in the stack. The overall size/overall area of the layers is equal in both examples, in the same manner as the thickness of a single layer is also equal in both examples.

Image 11.1 shows all dimensions of the PCB print with respect to size, cut-out, and bores. The PCB print overall size is 25 mm×25 mm and the total thickness of the PCB print is 1.55 mm from outer copper conductor track to the outer copper conductor track on the other side of the PCB print.

Image 11.2 shows the through holes for the RJ45 contacts and the through holes for the pin header and the through hole for the separate grounding line of the RJ45 chassis, as well as the cut-out for the pushbutton on top at the edge of the PCB print.

In image 11.3, the bottom assembly is shown with the defined positions for all electronic components, such as transformers, capacitors, resistors, and common mode choke.

Image 11.4 indicates all through bores having the corresponding diameters and the positions. The through bore diameters extend from 0.25, 0.80, 1.00, 1.20 to 1.70 mm.

In image 11.5, the conductive copper layer tracks of the uppermost layer are shown with the copper borders at the through bores of the RJ45 chassis contacts, pin header contacts, and the through bore of the grounding line for the RJ45 chassis.

Image 11.6 shows the inner copper layer 2 having the interruptions at the RJ45 contacts and the contacts at the pin header and the vias. Moreover, there is a region having a recess of the copper layer which extends transversely and perpendicularly above the pin header.

Image 11.7 shows the inner copper layer 3 having the interruptions at the RJ45 contacts and the contacts at the pin header and the vias. Moreover, there is a region having a recess of the copper layer which extends transversely and perpendicularly above the pin header.

In image 11.8, the copper conductor tracks and the copper regions of the lowermost layer for equipping the capacitors and the application of the solder depots can be seen, and the through bores for the mounting bolts.

The uppermost layer, which is shown in image 11.5, is oriented in the direction of the housing of the flush-type plug connector, whereas the lowermost layer is on the side facing away, thus on the side oriented to the rear, which also carries the pin header.

FIG. 12 shows in its individual images graphic representations on the basis of the Gerber file for the individual layers for signal transmission and grounding for a PCB layout according to the invention in a 1 GB/s variant. This special design layout is also used to ensure the EMC compatibility, because emission of the electromagnetic radiation is significantly reduced and the surrounding electronics are not impaired in their function by separate introduced grounding layer (see images 12.5, 12.6, 12.7, and 12.8).

All dimensions of the PCB print with respect to size, cut-out, and bores for mounting are again indicated in image 12.1. The PCB print overall size is, as also for the embodiment of FIG. 11, 25 mm×25 mm and is inserted vertically at the rear on the RJ45 chassis into the bolts and soldered on, the PCB print is thus mechanically fixed in its position and thus ensures easy installation in a matching opening in the housing and can be inserted from the front and then screwed on in a device flush with the housing front plate.

Image 12.2 shows the electronic structure of the so-called top assembly on the outside of the PCB print having the total of twelve capacitors, and the cut-out for the pushbutton in the PCB print on top and the passage bores for the RJ45 contacts and the passage bores for the pin header contacts.

Image 12.3 indicates the electronic structure of the so-called bottom assembly having the defined positions for all electronic components, such as transformers, capacitors, resistors, and common mode chokes.

Image 12.4 indicates all defined positions of the passage bores having the diameters 0.25, 0.60, 0.80, 1.20, and 1.70 mm.

Images 12.5 to 12.8 of FIG. 12 again contain the conductive copper layers, which are identified with the reference sign 21 in FIGS. 6 and 7 and are shown in black here. The white regions have no copper and are therefore insulation or dielectric material.

In image 12.5, the uppermost layer having the conductive copper layer and copper conductor tracks and having the copper borders at the passage contact bores of the RJ45 chassis is shown. Furthermore, the through contact bores of the pin header and the through bore of the grounding line of the RJ45 chassis can be seen in the direction of the PCB print.

Image 12.6 shows the first inner copper layer having the interruptions at the RJ45 contacts and the contacts at the pin header and the vias. Moreover, there is a region having a recess of the copper layer which extends transversely and perpendicularly above the pin header.

Image 12.7 shows the second inner copper layer having the interruptions at the RJ45 contacts and the contacts at the pin header and the vias. Moreover, there is a region having a recess of the copper layer, which extends transversely and perpendicularly above the pin header.

In image 12.8, the copper conductor tracks and the copper regions for the equipping of the capacitors and the application of the solder depots can be seen, as well as the passage bores for the mounting pins.

Since a large number of electronic components is provided in the printed circuit board 6 for the flush-type plug connector for higher bandwidths, more intensive grounding accordingly also has to be used, which is shown in the images of FIGS. 11 and 12 by the regions marked in black on the individual layers. It can thus be seen that in the 100 MB/s variant of FIG. 11, two plates are sufficient for the grounding, while in the 1 GB/s embodiment of FIG. 12, four plates are advantageously used for the grounding. The total thickness of the PCB print itself remains equal with rather precisely 1.55 mm from the copper outer layer on one side to the second copper outer layer on the other side of the PCB print.

LIST OF REFERENCE NUMERALS 1 plug-in opening
2 housing
3 receptacle
4 actuating element
5 contact element
6 printed circuit board
7 connection element
8 pin header
9 mounting pin
10 mounting bore
11 mounting tab
12 mounting bore
13 chip-LAN transformer
14 common mode choke
15 resistor
16 capacitor
17 interference suppression capacitor
18 capacitor
19 interference suppression capacitor
20 mounting bore
21 copper layer
22 copper layer
23 dielectric material
24 copper layer
25 core dielectric material
26 copper layer
27 dielectric material
28 copper layer
29 through contact

The invention claimed is:

1. A plug connector for mechanical and electrical connection to cable plugs of data cables, the plug connector comprising:
  a) a housing having at least one plug-in opening for a complementary plug connector at a front of the housing,
  b) multiple electrical contact elements held inside the housing that protrude into the plug-in opening, and are led at a rear side of the housing to an outer side thereof,
  c) a printed circuit board mounted vertically oriented on the rear side of the housing on the outer side thereof, the printed circuit board having an
  d) an electrical circuit, and connection elements conductively connected to the electrical circuit that extend from the printed circuit board beyond a periphery of the housing for connection to further electronic assemblies,
  e) wherein the contact elements held inside the housing are electrically conductively connected to the circuit,
  f) the electrical circuit on the printed circuit board includes an assembly for galvanic isolation of the network signals, and
  g) and the assembly has at least one chip-LAN transformer mounted on the printed circuit board for each data line.

2. The plug connector as claimed in claim 1, further comprising a common mode choke also mounted on the printed circuit board assigned to each said chip-LAN transformer.

3. The plug connector as claimed in claim 1, wherein the electrical circuit includes an assembly for current limiting integrated on the printed circuit board.

4. The plug connector as claimed in claim 1, wherein the electrical circuit on the printed circuit board includes a network termination.

5. The plug connector as claimed in claim 1, wherein the printed circuit board is a multi-layered PCB print.

6. The plug connector as claimed in claim 5, wherein the multi-layered PCB print has a sequence of layers which comprises an uppermost copper layer, a first dielectric material, a first inner copper layer, a core dielectric material, a second inner copper layer, a second dielectric material, and a lowermost copper layer.

7. The plug connector as claimed in claim 6, wherein the core dielectric material has a greater thickness than at least one of the first or second dielectric material.

8. The plug connector as claimed in claim 6, wherein the inner copper layers have a greater thickness than at least one of the uppermost or the lowermost copper layer.

9. The plug connector as claimed in claim 6, wherein grounding takes place via one of the connection elements or one of the contact elements and the two inner copper layers and the lowermost copper layer.

10. The plug connector as claimed in claim 9, wherein the grounding via one of the contact elements and the grounding via one of the connection elements is interconnected via a capacitor.

11. The plug connector as claimed in claim 4, wherein the network termination is a Bob Smith termination.

12. The plug connector as claimed in claim 7, wherein the core dielectric material thickness is greater by a factor of 10 than at least one of the first or second dielectric material.

13. The plug connector as claimed in claim 8, wherein the inner copper thickness is greater by a factor of 2 than at least one of the uppermost or the lowermost copper layer.

14. The plug connector as claimed in claim 1, wherein the connection elements comprise pins that extend from the printed circuit board in the vertically oriented direction.

15. The plug connector as claimed in claim 14, wherein the pins extend from a pin header mounted on the printed circuit board.

* * * * *